United States Patent

Charrier et al.

Patent Number: 5,942,812
Date of Patent: Aug. 24, 1999

[54] PROXIMITY DETECTOR WITH A STABLE CURRENT SOURCE

[75] Inventors: Pierre Charrier, Migne-Auxances; Alain Tardivon, Dauves, both of France

[73] Assignee: Schneider Electric SA, Boulogne Billancourt, France

[21] Appl. No.: 08/972,246

[22] Filed: Nov. 18, 1997

[30] Foreign Application Priority Data

Nov. 18, 1996 [FR] France .................................. 96 14123

[51] Int. Cl.$^6$ .................................................. H01H 35/00
[52] U.S. Cl. .............................. 307/116; 307/18; 307/43; 307/52; 307/62
[58] Field of Search ..................... 307/116, 118, 307/43, 52, 62

[56] References Cited

U.S. PATENT DOCUMENTS

| 4,001,718 | 1/1977 | Wilson et al. ........................ 331/65 |
| 4,138,709 | 2/1979 | Colwill .................................. 361/180 |
| 4,328,433 | 5/1982 | Nodera et al. ........................ 307/311 |
| 4,344,071 | 8/1982 | Allen ...................................... 340/566 |
| 4,924,122 | 5/1990 | Harris ..................................... 307/570 |
| 5,463,333 | 10/1995 | Calder et al. ........................ 327/78 |
| 5,552,644 | 9/1996 | Calder et al. ........................ 307/116 |

FOREIGN PATENT DOCUMENTS

| 2 219 862 | 12/1989 | United Kingdom . |
| 2 262 998 | 7/1993 | United Kingdom . |

*Primary Examiner*—Jeffrey Gaffin
*Assistant Examiner*—E. Garlepp
*Attorney, Agent, or Firm*—Oblon, Spivak, McClelland, Maier & Neustadt, P.C.

[57] ABSTRACT

A proximity detector having a power switch 30 which is switched as a function of the approach of an object. The detector includes a MOS depletion transistor T1 which connects one of the terminals 15 of the detector to a control input of a power switch 30 through a control switch T2. A regulator stage 45 is coupled to T1 in order to keep T1 saturated in the closed condition of the detector and to regulate the gate voltage of T1 when the detector is in a open state.

5 Claims, 2 Drawing Sheets

… ….

PROXIMITY DETECTOR WITH A STABLE CURRENT SOURCE

BACKGROUND OF THE INVENTION

1. Field of the Invention

This invention relates to a proximity detector of the type with two terminals able to be connected to a charging circuit which includes a load put in series with an external, AC or DC, electrical power source in such a way that this source is in a position to supply the load and the detector.

2. Discussion of Background

Such detectors generally include, on the one hand a detector unit that may be inductive, capacitive, photoelectric, etc. to which a processing electronic circuit is connected that is capable of supplying a switch signal in response to the approach or the presence of an object or target and, on the other hand, an electronic power switch connected to the terminals of the detector to determine the opening and the closing of the charging circuit. The switch is commanded by the switch signal in such a way that it is off in the open condition of the detector and on in the closed condition of the detector.

To supply power to the electronic circuits of the detector, a current source is provided that must operate when the detector is open. The current then supplied by the source must be low and stable whatever the conditions of supply voltage and temperature. Furthermore, even when the detector is closed, it must be supplied with a residual voltage which must remain low and well controlled whatever the switched current passing through the power switch and which must vary only slightly with temperature.

SUMMARY OF THE INVENTION

The purpose of the invention is to make the current source for a detector with two terminals, of the type described, stable and precise, while at the same time preserving the low cost nature of the detector.

According to the invention, the current source comprises an MOS type transistor whose drain-source path, in the closed condition of the detector, forms part of a conduction path linking one terminal of the detector to a control input for the power switch, a regulator stage coupled to the first transistor in order to keep it saturated in the closed condition of the detector and to regulate its gate voltage in the open condition of the detector, the regulator stage including two bipolar transistors preferably paired in one and the same package, one of which has its base connected to the source of the MOS transistor through a reference voltage device and whose main path connects the gate of the MOS transistor to an output of the current source, and the other of which connects the source of the MOS transistor to said output via a reference resistance. It is advantageous to be able to use discrete electronic circuits in the detector conforming to the invention, particularly for its current source.

BRIEF DESCRIPTION OF THE DRAWINGS

The following description of an embodiment example of the invention, making reference to the appended drawings, will allow the characteristics of the invention and the results that it makes possible, to be well understood.

DETAILED DESCRIPTION OF THE PREFERRED EMBODIMENT

Figure 1:
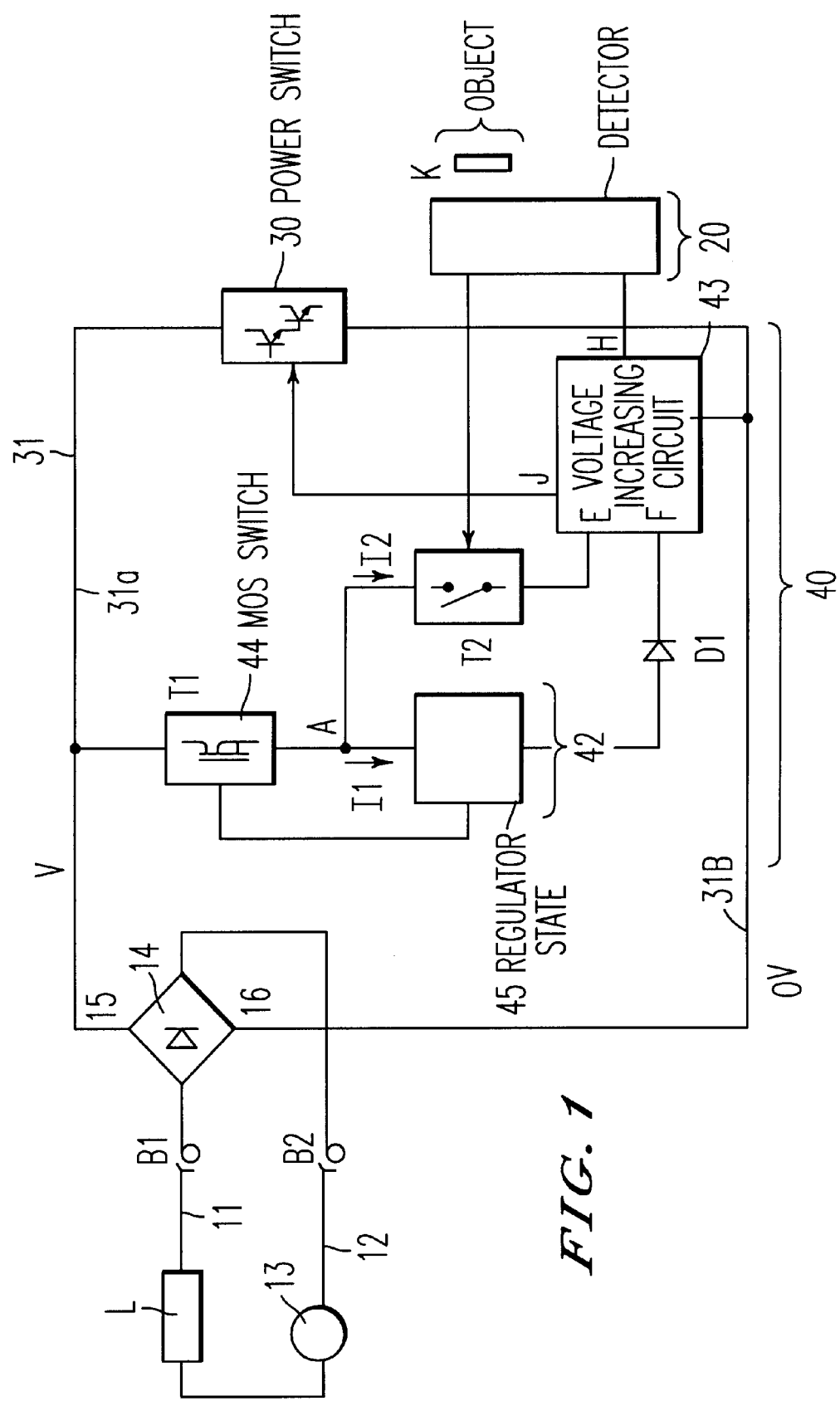
FIG. 1 diagrammatically represents the design of the electrical circuitry of the detector according to the invention.

The proximity detector 10 illustrated in the Figures is of the type with two terminals B1, B2, each able to be connected through respective wires 11, 12 to a load L arranged in series with a source of electrical energy 13. This source 13 is provided in order to supply power to the detector, whether it be open or closed, as well as to the load; it can be a DC or AC voltage source, the detector, in effect having at its input a dual half-cycle rectifier bridge 14.

The proximity detector includes a detector unit 20, an electronic power transistor switch 30 and a command device 40 for the switch and power supply control. The detector unit can be an inductive, capacitive, photoelectric etc. type, capable of supplying a switch signal S in response to the approach or the presence of an object or a target K; the electronic power switch 30 is arranged on a conductor 31 that connects the DC voltage terminals 15, 16 of the rectifier bridge 14, for example by means of a high voltage branch 31a at the potential V and a low voltage branch 31b at the potential 0V, and it is fixed to a control switch 41 for the device 40. Tche detector unit 20 is connected to an electronic processing circuit that is not shown.

In addition the device 40 includes a DC current source 42 and a voltage increasing circuit 43.

The current source 42 is connected between the high voltage branch 31a of the conductor 31, that is to say the terminal 15 of the bridge 14, and the voltage increasing circuit 43, to which it is connected via a diode D1; it has a regulator unit 44 constituted, according to the invention by an MOS depletion transistor T1, which allows adaptation to a broad range of power supply voltages, for example from 20 V to 264 V, and a regulator stage 45 which co-operates with T1. The drain of transistor T1 is connected to the branch 31a of the conductor 31 and its source A is connected to the regulator stage 45 and to a main terminal of the control switch 41, the other main terminal of which is connected to an input E of the voltage increasing circuit 43. The switch 41 is, for example, an MS transistor T2.

When the detector is quiescent (in the open or "not switched" condition), T2 is off and the current I1 which passes through transistor T1 is routed via the regulator stage 45 and a diode D1 to an input F of the voltage increasing circuit 43; when the detector is activated (in the closed or "switched" condition), T2 is on and passes a current I2 to the input E of circuit 43, this supplying a voltage that is higher at H than at E. The voltage generated by the circuit 43 at its output H is applied to the detector unit 20 and notably to its electronic circuit. The power switch 30 command signal is supplied through the output J of the voltage increasing circuit.

Figure 2:
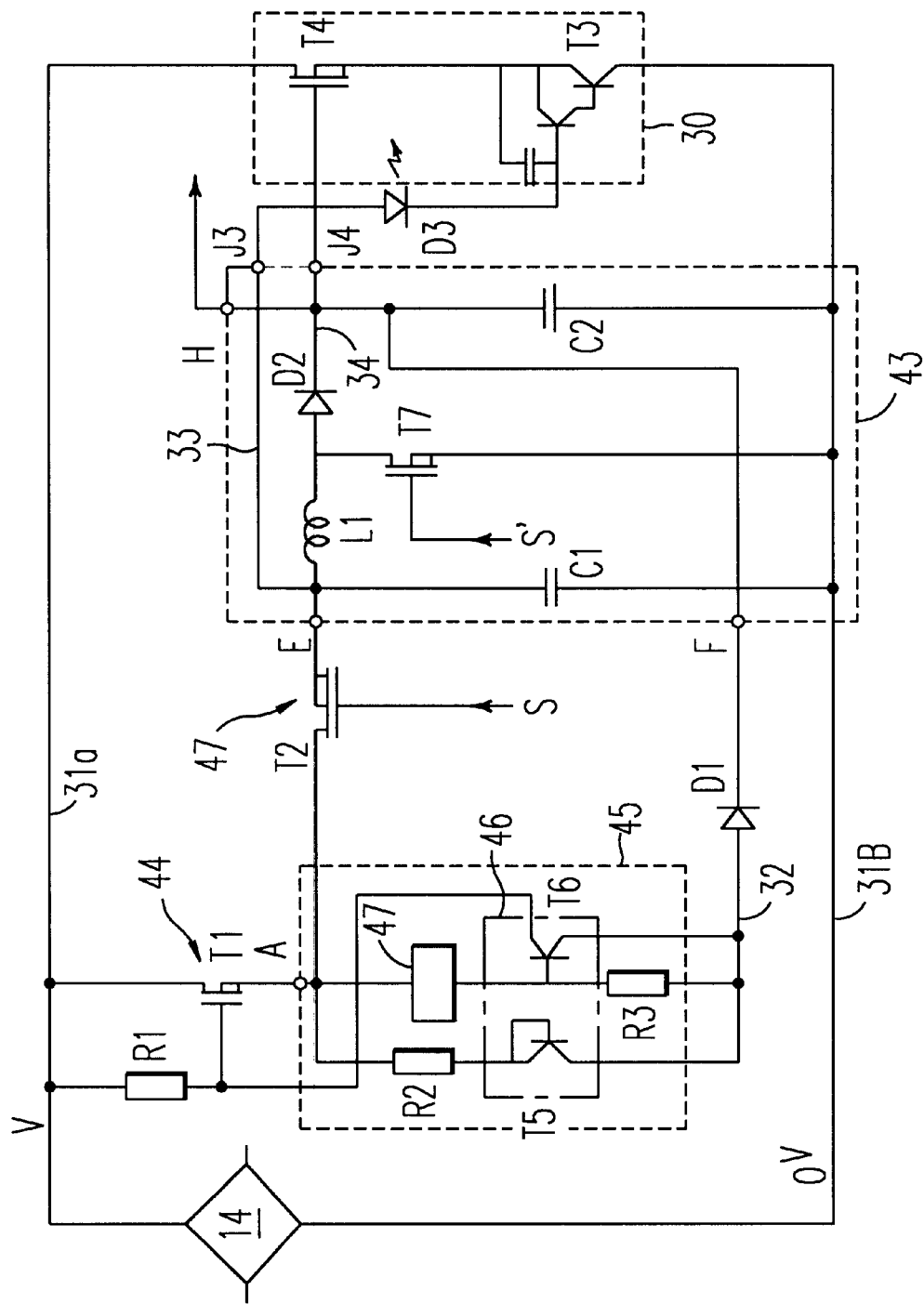
FIG. 2 shows in greater detail a part of the diagram of the detector from FIG. 1.

Part of the detector diagrammatically shown in FIG. 1 is represented in FIG. 2 in a way that better shows the constitution of the regulator stage 45 and the voltage increasing circuit 43 and their relationship with the other components. It should be noted that the power switch 30 is formed by a Darlington assembly, T3 cascaded with an MOS transistor T4. The MOS depletion transistor T1, constituted like T4 by a high voltage component, taking up little space has its drain connected to branch 31a and its gate also connected to branch 31a via a gate polarisation resistance R1. The point A to which the source of T1 is joined, is connected on the one hand, via a reference resistance R2 to the collector of a bipolar transistor T5 with a base-collector loop, the emitter of which is connected to a conductor 32 connected to the anode of the diode D1; on the other hand, the point A is connected via a reference voltage device 47, for example an active circuit or a Zener diode, to the base of a bipolar transistor T6 and via a resistance R3 to the conductor 32. It is advantageous that the transistors T5, T6 form part of one and the same component in both being paired in a single package 46, for example of an SOT 363 type.

The voltage increasing circuit 43 has an inductance L1 connected on the one side to the input E of the circuit which is connected to T2 and via a capacitance C1 to the branch 31b; on the other side, the inductance L1 is connected on the one hand to a diode D2, the cathode of which is connected at output J4 of circuit 43 to the gate of the MOS transistor T4 and on the other hand to the drain of an MOS transistor T7 for operating the voltage increasing circuit; the gate of T7 is actuated by a logic signal S' supplied by a clock and its source is set at the low potential of 31b. The cathode of D1 is connected to the point H, itself connected through a capacitance C2 to the low potential of 31b. Finally, the point E is connected at output J3 of the circuit 43 to the base of the Darlington transistor T3 by a conductor 33 that includes an electroluminescent diode D3.

The detector described operates in the following way.

In the detector's open condition (not switched), the signal S turns off the control transistor T2 and the signal S' turns off T7. The transistor T1 is on and the current I which passes through it and which mainly passes through R2 and T5 stays constant since the transistor T6 regulates the gate voltage of T1. T5 compensates for the voltage drop in T6. The current passing through the voltage reference circuit 47 and R3 is low in relation to that flowing through R2 and T5. The constant stable current I is routed via D1 to the point H to supply the detector unit.

In the detector's closed condition (switched), the signal S turns the transistor T2 on and the clock signal S' is active and permits excitation of T7. As T2 is on, the transistors T5 and T6 are off and T1 becomes saturated. The voltage drop in transistors T1 and T2 is small and the current that passes through them controls the power switch 30 through the outputs J3 and J4 of circuit 43, more precisely via a conductor 33 connecting the point E to the base of the Darlington transistor T3 and via the conductor 34 connecting the cathode of D2 to the gate of T4. The residual voltage of the detector remains small and in the form of an alternating square-wave voltage.

The current source described has several advantages. It can operate just as well under very low voltage as under high voltage thanks to the regulator stage 45. The transistors T5 and T6 of stage 45, paired in one and the same component package, make the current source very precise and stable, particularly in relation to temperature.

We claim:

1. A proximity detector circuit connected to a loading circuit including an external electrical power source in series with a load, said proximity detector circuit comprising:

a detector unit outputting a switching signal in response to the presence of an object to be detected;

a power switch responsive to said switching signal for switchably connecting together terminals of a charging circuit;

a direct current source connected to one of said terminals and to said detector unit, said direct current source including a MOS transistor having a drain-source path which forms part of a conduction path between said one terminal and a control input of said power switch when said switching signal of said detector unit is in a first state; and a regulator state coupled to said MOS transistor wherein said regulator state maintains said MOS transistor saturated when said switching signal is in said first state and wherein said regulator state regulates a gate voltage of said MOS transistor when said switching signal of said detector unit is in a second state, said regulator state including a first bipolar transistor having a base connected to a source of said MOS transistor through a reference voltage device wherein the emitter-collector main path of said first bipolar transistor connects a gate of said MOS transistor to an output of said direct current source, and said regulator state further including a second bipolar transistor having a collector-emitter path connecting the source of said MOS transistor to said output of said direct current source through a reference resistance.

2. A proximity detector according to claim 1, characterised in that the two bipolar transistors (T5, T6) are paired in one and the same component package.

3. A proximity detector circuit according to claim 1, wherein the drain-source path of the MOS transistor (T1) is connected in parallel to the power switch control input through the regulator stage and through a control switch (T2) wherein said control switch controls said power switch and wherein said control switch is actuated by said detector unit switching signal.

4. A proximity detector according to claim 3, characterised in that the control switch (T2) is connected to the power switch (30) through voltage increasing circuit (43) including a switch (T7) whose operation is fixed to a clock signal (S') operated in accordance with the state of the switch signal (S).

5. A proximity detector according to claim 1, characterised in that the power switch (30) is a transistor switch and that the MOS transistor (T1) is a depletion type transistor.

* * * * *